United States Patent [19]
Roggwiller

[11] Patent Number: 4,743,950
[45] Date of Patent: May 10, 1988

[54] THYRISTOR WITH SWITCHABLE EMITTER SHORT CIRCUIT

[75] Inventor: Peter Roggwiller, Riedt, Switzerland

[73] Assignee: BBC Brown, Boveri & Company, Limited, Baden, Switzerland

[21] Appl. No.: 940,921

[22] Filed: Dec. 12, 1986

[30] Foreign Application Priority Data
Dec. 12, 1985 [CH] Switzerland ............... 5305/85

[51] Int. Cl.[4] .............................. H01L 29/06
[52] U.S. Cl. ..................... 357/20; 357/38; 357/55; 357/72; 307/305
[58] Field of Search ............ 307/252 A, 252 C, 252 J, 307/305; 357/38, 39, 20, 55, 72

[56] References Cited

U.S. PATENT DOCUMENTS

| | | | |
|---|---|---|---|
| 3,622,841 | 11/1971 | Zoroglu | 357/55 |
| 4,298,881 | 11/1981 | Sakurada et al. | 357/38 |
| 4,398,205 | 8/1983 | Spellman et al. | 357/38 |

FOREIGN PATENT DOCUMENTS 2130028 5/1984 United Kingdom .

OTHER PUBLICATIONS

J. Mena et al., "High Freq. Perf. of VDMOS Power Trans.," 1980 Proc. I.E.D.M., pp. 91–94.

Primary Examiner—Joseph E. Clawson, Jr.
Attorney, Agent, or Firm—Oblon, Fisher, Spivak, McClelland & Maier

[57] ABSTRACT

In thyristor having disconnectable emitter short circuits provided by means of monolithically integrated transistor structure, wherein a simplified production and improved control of the short circuits is achieved by the fact that a bipolar structure is integrated as the transistor structure into the component. In a preferred illustrative embodiment, the $n^+$-type emitter layer of the thyristor is interrupted by intermediate spaces in which the transistor structure is in each case disposed.

9 Claims, 2 Drawing Sheets

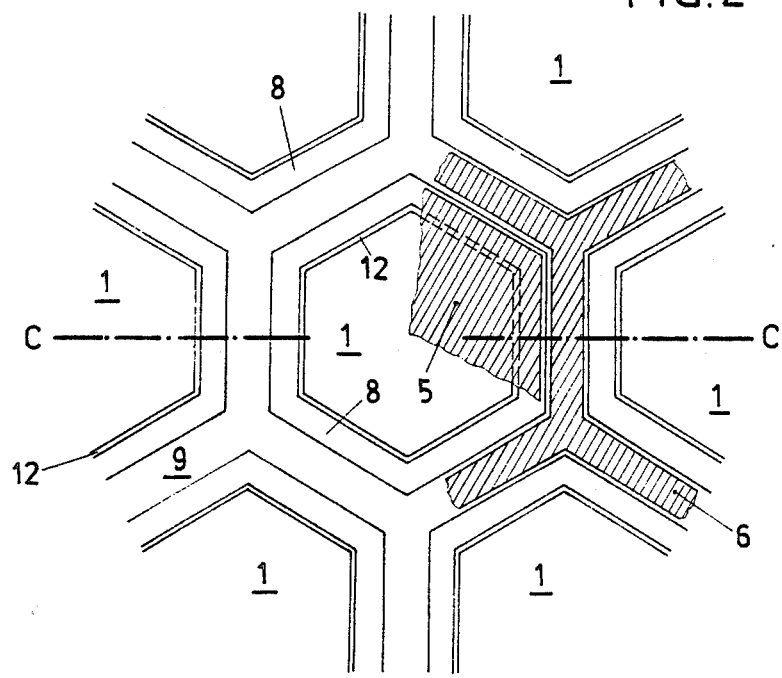
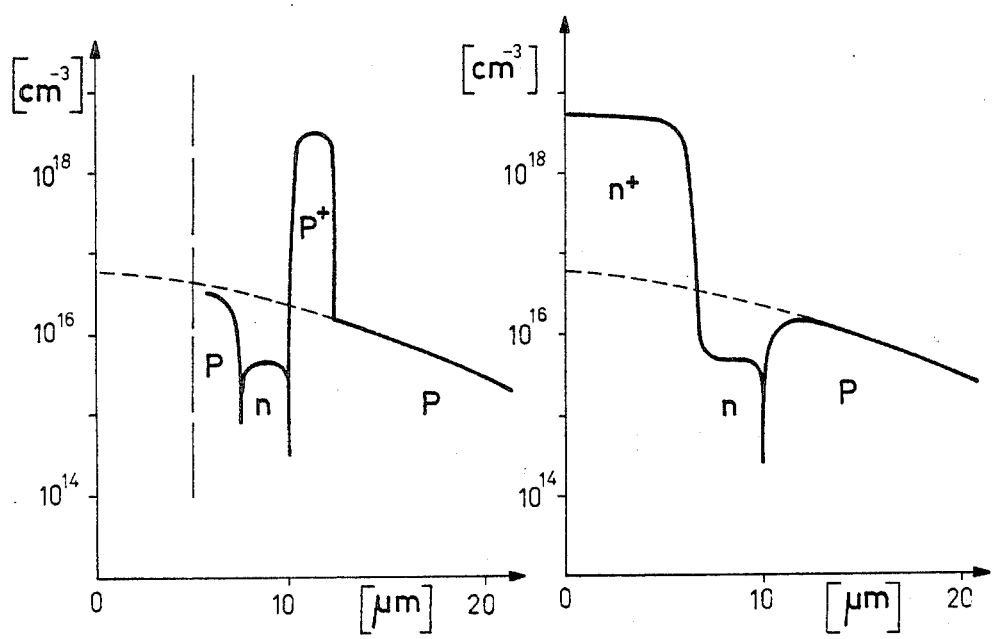

THYRISTOR WITH SWITCHABLE EMITTER SHORT CIRCUIT

BACKGROUND OF THE INVENTION

1. Field of the Invention

The present invention relates to a thyristor having a switchable emitter short circuit, such as of claim 1. Such a is known, for example, from German Offenlegungsschrift No. 3,118,347.

2. Discussion of Background

In thyristor technology, local fixed emitter short circuits have been installed for a long time on the cathode side of the thyristor in order to ensure that the component is capable of turning off even with a very rapid rise ($dU_A/dt$) of the anode voltage (see, for example, Gentry, F. E.; et al. "Semiconductor Controlled Rectifiers", Prentice Hall Inc., 1964, page 138 f.). Due to the emitter short circuits, displacement currents such as occur during rapid voltage rises can flow away without gating the npn part-transistor of the thyristor.

Besides the advantage of improved turn-off capability, however, the fixed emitter short circuits have the disadvantage of decreased triggering sensitivity and of an increased holding current. In addition, the short circuits represent an obstruction to the propagation of the triggering front which has the effect of limiting the rate of current rise ($dI/dt$) on turn-on.

To avoid these disadvantages, it has been proposed (see, for example, German Offenlegungsschrift No. 3,118,353), to switch the emitter short circuits on and off in accordance with the switching state of the thyristor, the emitter short circuits being interrupted or disconnected during the firing process and in the conducting state of the thyristor and being connected during the turn-off state.

In the printed document mentioned, the switchability of the emitter short circuits is achieved by the fact that the regions of the thyristor p-base layer appearing at the surface are contacted independently of the cathode and can be conductively connected to the cathode via an external field effect transistor (FET) acting as a switch.

According to the teaching from the initially mentioned German Offenlegungsschrift No. 3,118,347, the FET switch can also be monolithically integrated directly into the thyristor structure in the form of an MIS-FET structure.

These known solutions have the common feature that field effect transistors are used as switching elements for the emitter short circuits. Since, in principle, the driving voltage for the current flowing in the emitter short circuit is less than about 0.7 Volt, the aim in dimensioning must be as low as possible a path resistance in order to achieve a sufficiently high short-circuit current. This requires small lateral distances between the individual short circuits and low resistances in the switching transistors in the switched-in state.

Since the field effect transistors, however, display an approximately resistive behavior with respect to their conducting-state characteristic, that is to say the voltage dropped across the switch always increases approximately proportionally to the current, the maximum short-circuit current is limited right from the start by the structure of the switching element.

SUMMARY OF THE INVENTION

Accordingly, one object of this invention is to provide a novel thyristor having a disconnectable emitter short circuit in which the maximum short-circuit current in the emitter short circuit is clearly increased and the effectiveness of the short circuit can be controlled over a wide range.

The above object and other objects are achieved according to the invention by providing a novel thyristor having a switchable emitter short circuit, including a sequence of layers consisting of a p-type emitter layer, an $n^-$-type base layer, a p-type emitter layer and a $n^+$-type emitter layer, and a bipolar transistor for short-circuiting the $n^+$-type emitter layer, which bipolar transistor is monolithically integrated into the thyristor and is externally controllable.

Compared with the FET, constructing the externally controllable transistor structure as a bipolar transistor in accordance with the invention has the advantage that the collector-emitter voltage of the bipolar transistor is largely independent of the respective collector current in saturation mode with about 0.2–0.3 Volt and the short-circuit current can thus be controlled over a wide range by appropriate selection of the base current. At the same time, the limiting effect existing with the FET is eliminated by the resistive behavior of the FET channel.

In addition, the monolithic integration of a bipolar transistor has the further advantage that the entire component can be produced in pure bipolar technology which considerably simplifies production.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a top view of a portion of the cathodeside planar structure of a thyristor according to FIG. 1 with individual hexagonal elements of the $n^+$ emitter layer;

FIG. 3A is a group showing the variation of the doping concentration along line A—A in FIG. 1; and FIG. 3B is a group showing the corresponding doping contour along line B—B in FIG. 1.

DESCRIPTION OF THE PREFERRED EMBODIMENTS

Figure 1:
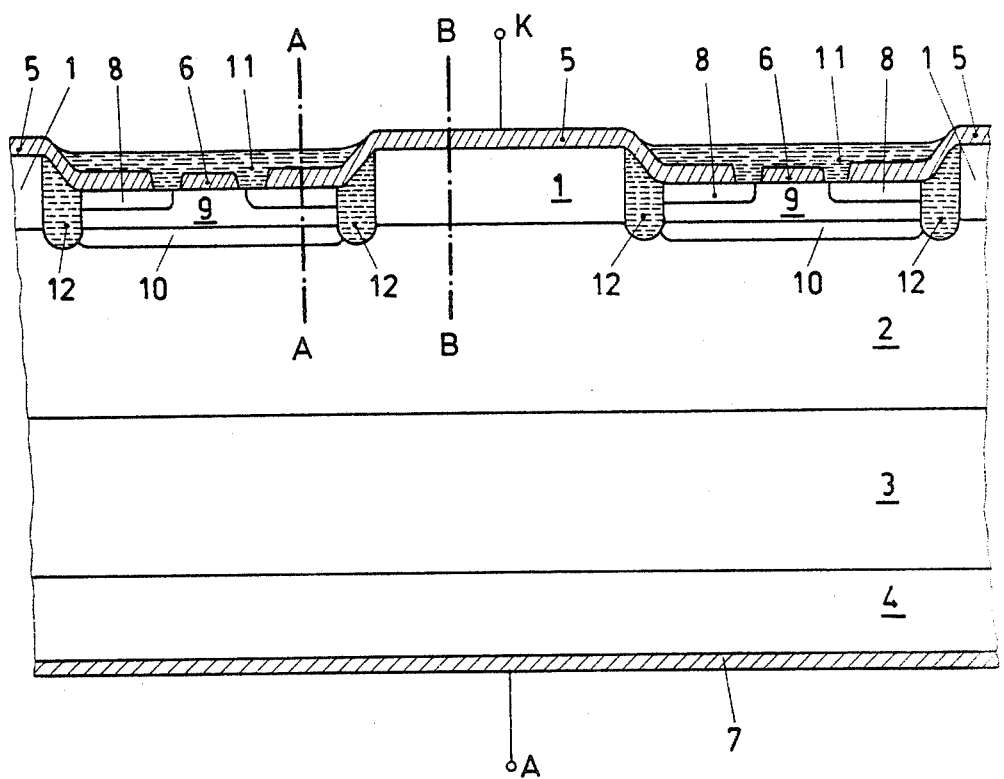
FIG. 1 is a cross-sectional view through a thyristor structure having a monolithically integrated transistor structure according to a preferred embodiment of the invention.

Referring now to the drawings, wherein like reference numerals designate identical or corresponding parts throughout the several views, and more particularly to FIG. 1 thereof, there is shown a section of the cross-section through a thyristor structure with a monolithically integrated bipolar transistor structure according to a preferred embodiment. The thyristor structure is formed by a sequence of a differently doped layers which comprises, from bottom to top, a p-type emitter layer 4, an $n^-$-type base layer 3, a p-type base layer 2 and an $n^+$-type emitter layer 1. On the surface of the p-type emitter layer 4, a metallic anode contact 7, constructed, for example, as aluminum film, is applied and connected to the anode A of the thyristor. Correspondingly, on the surface of the $n^+$-type emitter layer 1, a cathode contact 5 is provided which is connected to the cathode K of the thyristor. The triggering devices basically present in the thyristor and the associated gate contacting are of conventional design in the present thyristor and have therefore not been drawn in FIG. 1 for the sake of clarity.

The bipolar transistor structure, which is shown twice in FIG. 1, comprises a sequence of layers of p+-doped emitter 10, a n-doped base 9 and a p-doped collector 8, which forms a pnp transistor.

The n+-type emitter layer 1 of the thyristor structure is not constructed to be continuous but interrupted by intermediate spaces. In these intermediate spaces, the transistor structure described is in each case arranged, the variously doped semiconductor layers of the transistor structure extending largely parallel to the corresponding layers of the thyristor structure.

The underside of the emitter 10 of the transistor structure flatly adjoins the p-type base layer 2 in the intermediate space so that the emitter 10 is directly conductively connected to this layer. The collector 8 is also electrically connected to the cathode K of the thyristor. This is achieved by means of the cathode contact 5 which laterally projects past the area of the n+-type emitter layer 1 to such an extent that it partially overlaps and comes into contact with the collector 8 of the adjacent transistor structure.

In the center area of the structure, the base 9 of the transistor structure passes through the plane of the collector 8 to the surface and is there provided with a base contact 6 which allows the transistor structure to become externally controllable. Overall, the combined thyristor-transistor structure in cross-section is periodical with alternately a transistor structure and an n+-type emitter layer 1 at least in the areas where the emitter short circuits are provided.

Between the transistor and thyristor part structures, deep troughs 12, which can be created, for example, by an anisotropic etching process, are preferably provided for electrically separating the thyristor and transistor. The troughs 12 are advantageously filled with an insulating material, especially polyimide, and covered by the overlapping cathode contact. In this arrangement, the depth of the troughs 12 is selected in such a manner that they reach at least to the p-type base layer 2.

The transistor structure including the base contact 6 and the overlapping areas of the cathode contact 5 can also be covered with a cover layer 11 of polyimide for passivation purposes. The part of the cathode contact 5 located above the n+-type emitter layer 1, however, is left free for the contact with a cathode-side pressure contact (not shown).

Whilst FIG. 1 shows the combined structure in cross-section, FIG. 2 shows how, in a preferred illustrative embodiment, the structures are arranged in the plane, seen from the cathode side, to achieve as uniform as possible a current distribution and thus loading of the component.

The planar structure is composed of a plurality of regularly arranged individual hexagonal elements of the n+-type emitter layer 1 which do not directly abut each other but are in each case surrounded on all sides by an intermediate space which accommodates the transistor structure. Since the cathode contacts 5 and the base contact 6 have been drawn only in section as shaded areas, the transistor structure reveals the honeycomb-shaped base 9 emerging at the surface of the structure and the various part areas of the collector 8. Similarly, the troughs 12 can be seen which surround each individual hexagonal element of the n+-type emitter layer. A cross-section along the line C—C shown in FIG. 2 corresponds to the illustration of FIG. 1.

The transistor structure spread out in the shape of a honeycomb forms a single short-circuit switch which is distributed over the area and which short-circuits the cathode K to the p-type base layer 2 with a current to the base 9. The switched emitter short circuits have a particularly favorable effect on the operational behavior of the thyristor if the lateral distances between the individual hexagonal elements are within the range from about 200 $\mu$m to 1000 $\mu$m which corresponds to halving the distances used with unswitched short circuits.

In addition, the thyristor can also be actively turned off with the aid of the structure shown in FIGS. 1 and 2. For this purpose, however, the lateral distances mentioned must be smaller than 50 $\mu$m.

FIGS. 3A and 3B show the doping contours preferably used for the transistor and thyristor, as obtained along the lines A—A and B—B, respectively, drawn in FIG. 1. In this arrangement, the doping concentration specified in cm$^{-3}$ is applied over the depth specified in $\mu$m, measured from the cathode-side surface of the n+-type emitter layer 1.

In FIG. 3A the doping contour of the lower thyristor structure begins only at a depth of about 5 $\mu$m with the p-type doping of the collector 8, followed by a lesser n-type doping of the base 9 and the strong p+-type doping of the emitter 10 which changes over to the basic p-type doping of the p-type base layer 2 of the thyristor.

The doping contour of the thyristor in FIG. 3B begins with high n+-type doping of the n+-type emitter layer 1, followed by an intermediate layer with low n-type doping (not shown in FIG. 1.) and by the basic p-type doping of the p-type base layer 2 of the thyristor.

The n-doped intermediate layer in the thyristor is obtained if, according to a preferred illustrative embodiment, the n+-type emitter layer 1 is a layer generated by epitaxial growth on the p-type base layer 2.

In addition, it is also of advantage if the emitter 10 is produced by implantation in the p-type base layer 2.

As already mentioned, the surface of the transistor structure is lower by about 5 $\mu$m than that of the thyristor structure. As a result, different planes are created for the cathode contact 5 and the base contact 6 which considerably facilitate the connection of the component.

Overall, the invention provides a thyristor with switchable emitter short circuits, which cannot only be produced completely in only one technology and thus more simply, but, above all, is distinguished by improved control of the short circuits.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. Thyristor having a switchwable emitter short circuit, comprising:
 a sequence of layers comprising a p-type emitter layer, an n$^-$-type base layer, a p-type base layer and an n+-type layer serving as a cathode emitter layer; and a bipolar transistor for short-circuiting the n+-type emitter layer, said bipolar transistor monolithically integrated into said sequence of layers and externally controllable;

wherein the n+-type emitter layer comprises a regular arrangement of a plurality of individual hexagonal elements lying in a common plane, and each individual hexagonal element is surrounded by the bipolar transistor and is separated thereby from the other elements.

2. Thyristor as claimed in claim 1, comprising:

the bipolar transistor comprising a sequence of layers of three layers, essentially disposed one above the other, including a lower layer which is p+-doped and forms an emitter, a center layer which is n-doped and forms a base, and an upper layer which is p-doped and forms a collector of the bipolar transistor;

the collector electrically connected to the cathode of the thyristor;

a base contact formed on the base by which the base can be externally driven; and the emitter electrically connected to the p-type base layer.

3. Thyristor as claimed in claim 2, comprising:

the n+-type emitter layer of the thyristor interrupted by intermediate spaces, in each of which intermediate spaces of the bipolar transistor is disposed; and the emitter of the transistor having an underside which flatly adjoins the p-type base layer.

4. Thyristor as claimed in claim 1, comprising:

troughs which electrically separate the bipolar transistor from the n+-type emitter, said troughs extending to the p-type base layer; and said troughs filled with an insulating material.

5. Thyristor as claimed in claim 4, wherein the insulating material filling said troughs comprises polyimide.

6. Thyristor as claimed in claim 5, comprising:

a cathode contact for making an electric connection between the cathode of the thyristor and the collector of the transistor structure, said cathode contact comprising a layer of metallization which covers the n+-type emitter layer and projects past the area of each individual hexagonal element to such an extent that it partially overlaps and comes in contact with the collector of the adjacent transistor.

7. Thyristor as claimed in claim 1, wherein the individual hexagonal elements are separated by lateral distances which are between 200 $\mu$m and 1000 $\mu$m.

8. Thyristor as claimed in claim 1, wherein the lateral distances between the individual hexagonal elements are smaller than 50 $\mu$m.

9. Thyristor as claimed in claim 3, wherein:

the base of the transistor passes through a center area of the plane of the collector to the surface of the transistor and is there provided with the base contact; and the base contact is located in a different plane than the cathode contact.

* * * * *